US012626756B1

(12) United States Patent
Hunt-Schroeder et al.

(10) Patent No.: US 12,626,756 B1
(45) Date of Patent: May 12, 2026

(54) FEEDBACK-REINFORCED ACCELERATED AGING FOR IMPROVED PUF STABILITY

(71) Applicant: Marvell Asia Pte Ltd, Singapore (SG)

(72) Inventors: Eric Hunt-Schroeder, Essex Junction, VT (US); Tian Xia, Burlington, VT (US)

(73) Assignees: MARVELL ASIA PTE LTD, Singapore (SG); UNIVERSITY OF VERMONT AND STATE AGRICULTURAL COLLEGE, Burlington, VT (US)

( * ) Notice: Subject to any disclaimer, the term of this patent is extended or adjusted under 35 U.S.C. 154(b) by 88 days.

(21) Appl. No.: 18/540,422

(22) Filed: Dec. 14, 2023

Related U.S. Application Data

(60) Provisional application No. 63/432,859, filed on Dec. 15, 2022.

(51) Int. Cl.
   *G11C 11/4096* (2006.01)
   *G11C 11/4078* (2006.01)
   *G11C 11/4091* (2006.01)
(52) U.S. Cl.
   CPC ...... *G11C 11/4096* (2013.01); *G11C 11/4078* (2013.01); *G11C 11/4091* (2013.01)
(58) Field of Classification Search
   CPC ............ G11C 11/4096; G11C 11/4078; G11C 11/4091
   See application file for complete search history.

(56) References Cited

U.S. PATENT DOCUMENTS

| | | | |
|---|---|---|---|
| 5,515,540 A | 5/1996 | Grider et al. | |
| 5,736,777 A | 4/1998 | Shield et al. | |
| (Continued) | | | |

FOREIGN PATENT DOCUMENTS

| | | |
|---|---|---|
| CN | 205281504 U | 6/2016 |
| JP | 2017163030 | 9/2017 |

OTHER PUBLICATIONS

Liu et al. ("A 0.5-V Hybrid SRAM Physically Unclonable Function Using Hot Carrier Injection Burn-In for Stability Reinforcement", IEEE Journal of Solid-State Circuits, vol. 56, No. 7, Jul. 2021) (Year: 2021).*

(Continued)

*Primary Examiner* — Mushfique Siddique

(57) ABSTRACT

A method of operating a chip as an entropy source for generating a physical unclonable function (PUF) key includes: arranging in the chip a pre-amplifier array of bitcells in respective rows defined by respective pairs of true and complement wordlines and in columns defined by respective pairs of true and complement bitlines; reading, by a sense amplifier, a preferred state from a bitcell along a selected pair of the pairs of true and complement wordlines, where the pre-amplifier array of bitcells comprises the bitcell; performing feedback-reinforced accelerated aging via control circuitry in the chip including, based on the read preferred state, applying a stress condition that causes an accelerated aging effect including biasing the bitcell to the preferred state to reinforce the preferred state in the bitcell; subsequent to performing the feedback-reinforced accelerated aging, reading a value from the bitcell; and generating a PUF key using the value.

23 Claims, 5 Drawing Sheets

500

| Arrange an array of bitcells along bitline columns and word line rows | 501 |

↓

| Read a preferred state from a bitcell using a sense amplifier along a bitline | 502 |

↓

| Determine a stress condition which biases the bitcell to the preferred state | 503 |

↓

| Apply the stress condition which biases the bitcell to the preferred state to the bitcell | 504 |

↓

| Read a value from the bitcell | 505 |

↓

| Generate a PUF key using the value | 506 |

(56) References Cited

U.S. PATENT DOCUMENTS

| | | | | |
|---|---|---|---|---|
| 6,588,672 | B1 | 7/2003 | Usami | |
| 8,981,810 | B1 * | 3/2015 | Trimberger | H03K 19/003 |
| | | | | 326/8 |
| 9,577,637 | B2 * | 2/2017 | Pedersen | H03K 3/356 |
| 9,967,094 | B2 * | 5/2018 | Zhang | G06F 7/588 |
| 11,962,709 | B1 * | 4/2024 | Hunt-Schroeder | H04L 9/0866 |
| 2012/0179952 | A1 | 7/2012 | Tuyls et al. | |
| 2015/0092777 | A1 | 4/2015 | Watanabe | |
| 2015/0236698 | A1 * | 8/2015 | Pedersen | H03K 19/00384 |
| | | | | 326/8 |
| 2017/0142082 | A1 | 5/2017 | Qian | |
| 2017/0142090 | A1 | 5/2017 | Mahaffey et al. | |
| 2017/0201382 | A1 | 7/2017 | Lindteigen | |
| 2018/0013562 | A1 | 1/2018 | Auh | |
| 2018/0075262 | A1 | 3/2018 | Haider et al. | |
| 2018/0137293 | A1 | 5/2018 | Lucas et al. | |
| 2018/0159685 | A1 | 6/2018 | Kwak | |
| 2018/0278418 | A1 | 9/2018 | Chang et al. | |
| 2019/0140851 | A1 | 5/2019 | Ma et al. | |
| 2019/0221254 | A1 | 7/2019 | Liu et al. | |
| 2019/0305972 | A1 * | 10/2019 | Yao | H04L 9/3278 |
| 2020/0136839 | A1 | 4/2020 | Tsai et al. | |
| 2020/0350264 | A1 | 11/2020 | Park | |
| 2022/0191223 | A1 | 6/2022 | Zifroni et al. | |

OTHER PUBLICATIONS

Herder, C., et al., "Physical Unclonable Functions and Applications: A Tutorial," *2014 Proceedings of the IEEE*, vol. 102, No. 8, pp. 1126-1141 (Aug. 8, 2014).

Hunt-Schroeder, E., et al., "Pre-Amplifier Based Entropy Source with Stable Output for use in a Physical Unclonable Function," *2021 IEEE Microelectronics Design & Test Symposium (MDTS)*, pp. 1-6 (May 18-21, 2021).

Hunt-Schroeder, E., et al., "Integrating Physical Unclonable Function and Self-Destruction Design to Safeguard Integrated Circuit," *GOMACTech 2022*, pp. 1-6 (Mar. 21-24, 2022).

* cited by examiner

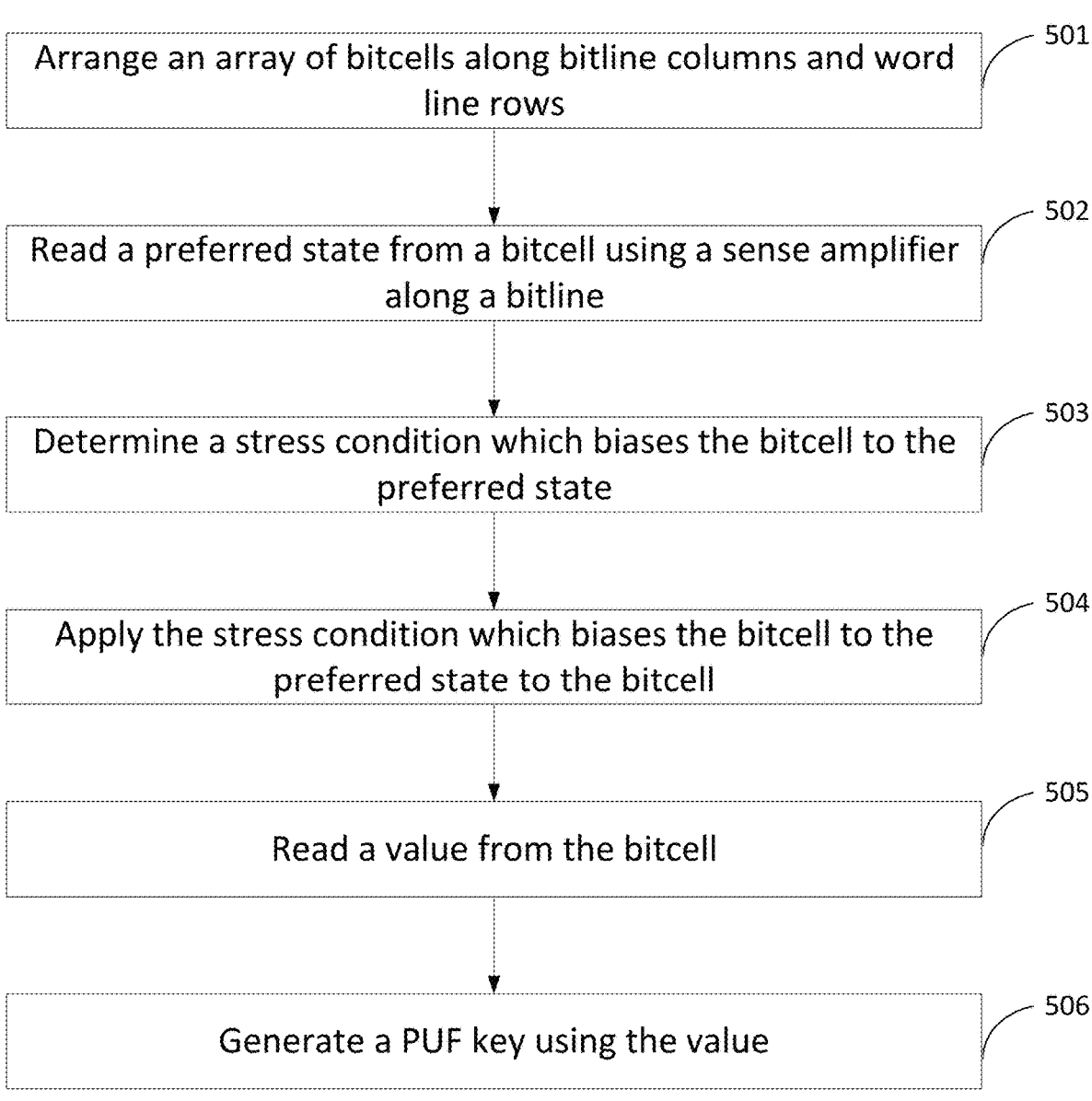

500

Arrange an array of bitcells along bitline columns and word line rows — 501

Read a preferred state from a bitcell using a sense amplifier along a bitline — 502

Determine a stress condition which biases the bitcell to the preferred state — 503

Apply the stress condition which biases the bitcell to the preferred state to the bitcell — 504

Read a value from the bitcell — 505

Generate a PUF key using the value — 506

*FIG. 5*

FEEDBACK-REINFORCED ACCELERATED AGING FOR IMPROVED PUF STABILITY

CROSS REFERENCE TO RELATED APPLICATIONS

This disclosure claims the benefit of commonly-assigned U.S. Provisional Patent Application No. 63/432,859, filed Dec. 15, 2022, which is hereby incorporated by reference herein in its entirety.

FIELD OF USE

This disclosure relates to stabilizing bitcells for generating a PUF key. More particularly, this disclosure relates to applying accelerated aging to a bitcell.

BACKGROUND

The background description provided herein is for the purpose of generally presenting the context of the disclosure. Work of the inventors hereof, to the extent that that work is described in this background section, as well as aspects of the description that may not otherwise qualify as prior art at the time of filing, are neither expressly nor impliedly admitted to be prior art against the subject matter of the present disclosure.

Physical Unclonable Functions (PUFs) generate secure encryption keys for a semiconductor device based on intrinsic process variations in the fabrication of the device. PUFs are used for chip authentication through a random, unique, and repeatable on-chip secret key that is generated on request. The ability to reliably regenerate the PUF key under any test condition is extremely difficult. Many designs suggest PUF key error rates (KER), which measure the probability of a bit flipping values, at $10^{-6}$.

SUMMARY

In accordance with implementations of the subject matter of this disclosure, a method for reinforcing an unstable bitcell in an entropy source, for use in generating a physical unclonable function (PUF) key, includes arranging an array of bitcells in respective rows defined by respective pairs of true and complement wordlines and in columns defined by respective pairs of true and complement bitlines, reading, by a first sense amplifier connected to a first pair of true and complement bitlines, a first preferred state from a first bitcell along a first selected pair of true and complement wordlines, determining a first stress condition that causes an accelerated aging effect in the first bitcell which biases the first bitcell to the first preferred state for the first bitcell, applying the first stress condition to the first bitcell, reading a first value from the first bitcell, and generating a first PUF key using the first value.

In a first implementation of such a method, applying the first stress condition may include applying a first voltage to a first portion of the first bitcell which is biased toward the first preferred state for the first bitcell, and applying a second voltage lower than the first voltage to a second portion of the first bitcell which is biased away from the first preferred state for the first bitcell.

In a second implementation of such a method, applying the first stress condition may include applying the first stress condition for longer than a threshold duration.

In a second implementation of such a method, applying the first stress condition may include causing the unstable bitcell to exhibit one or more of (1) biased temperature instability or (2) hot carrier injection.

A third implementation of such a method may further include reading, by a second sense amplifier connected to a second pair of true and complement bitlines, a second preferred state from a second bitcell along the first selected pair of true and complement wordlines, determining a second stress condition that causes an accelerated aging effect in the second bitcell which biases the second bitcell to the second preferred state for the second bitcell, and applying the second stress condition to the second bitcell, and reading a second value from the first bitcell, where generating the first PUF key may further include using the second value.

According to a first aspect of that third implementation, the first stress condition and the second stress condition may be applied simultaneously.

According to a second aspect of that third implementation, applying the first stress condition to the first bitcell may include activating a first source voltage local to the first bitcell and applying the second stress condition to the second bitcell may include applying a second source voltage local to the second bitcell.

According to a third aspect of that third implementation, applying the first stress condition to the first bitcell and applying the second stress condition to the second bitcell may include applying a voltage source to the first selected pair of true and complement wordlines.

A fourth aspect of that third implementation may further include, after reading the first value from the first bitcell, deactivating the first bitcell by applying a zero voltage to the true wordline of the selected pair of true and complement wordlines and a source voltage to the complement wordline of the selected pair of true and complement wordlines to prevent the first value from being read outside of the entropy source.

In accordance with implementations of the subject matter of this disclosure, an entropy source for generating a PUF key includes an array of bitcells arranged in respective rows defined by respective pairs of true and complement wordlines and in columns defined by respective pairs of true and complement bitlines, a first sense amplifier connected to a first pair of true and complement bitlines configured to read a first preferred state from a first bitcell along a first selected pair of true and complement wordlines, and control circuitry configured to determine a first stress condition that causes an accelerated aging effect in the first bitcell which biases the first bitcell to the first preferred state for the first bitcell, and apply the first stress condition to the first bitcell, where the first sense amplifier is further configured to read a first value from the first bitcell, and the entropy source further includes key generation circuitry configured to generate a first PUF key using the first value.

In a first implementation of such an entropy source for generating a PUF key, the control circuitry may be configured to, when applying the first stress condition, apply a first voltage to a first portion of the first bitcell which is biased toward the first preferred state for the first bitcell, and apply a second lower than the first voltage to a second portion of the first bitcell which is biased away from the first preferred state for the first bitcell.

In a second implementation of such an entropy source for generating a PUF key, the control circuitry may be configured to, when applying the first stress condition, apply the first stress condition for longer than a threshold duration.

In a third implementation of such an entropy source for generating a PUF key, the control circuitry may be configured to, when applying the first stress condition, cause the unstable bitcell to exhibit one or more of (1) biased temperature instability or (2) hot carrier injection.

A fourth implementation of such an entropy source for generating a PUF key may further include a second sense amplifier connected to a second pair of true and complement bitlines configured to read a second preferred state from a second bitcell along the first selected pair of true and complement wordlines, where the control circuitry may further be configured to determine a second stress condition that causes an accelerated aging effect in the second bitcell which biases the second bitcell to the second preferred state for the second bitcell, and apply the second stress condition to the second bitcell, and the second sense amplifier may further be configured to read a second value from the second bitcell, and the entropy source may further include key generation circuitry configured to generate the first PUF key by also using the second value.

According to a first aspect of that fourth implementation, the control circuitry may further be configured to apply the first stress condition and the second stress condition simultaneously.

According to a second aspect of that fourth implementation, the control circuitry may further be configured to, when applying the first stress condition to the first bitcell, activate a first source voltage local to the first bitcell, and when applying the second stress condition to the second bitcell, apply a second source voltage local to the second bitcell.

According to a third aspect of that fourth implementation, the control circuitry may further be configured to, when applying the first stress condition to the first bitcell and applying the second stress condition to the second bitcell, apply a voltage source to the first selected pair of true and complement wordlines.

In a fifth implementation of such an entropy source for generating a PUF key, the control circuitry may further be configured to, after reading the first value from the first bitcell, deactivate the first bitcell by applying a zero voltage to the true wordline of the selected pair of true and complement wordlines and a source voltage to the complement wordline of the selected pair of true and complement wordlines to prevent the first value from being read outside of the entropy source.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which:

FIG. 5 is a flow diagram illustrating a method according to implementations of the subject matter of this disclosure.

DETAILED DESCRIPTION

Figure 1:
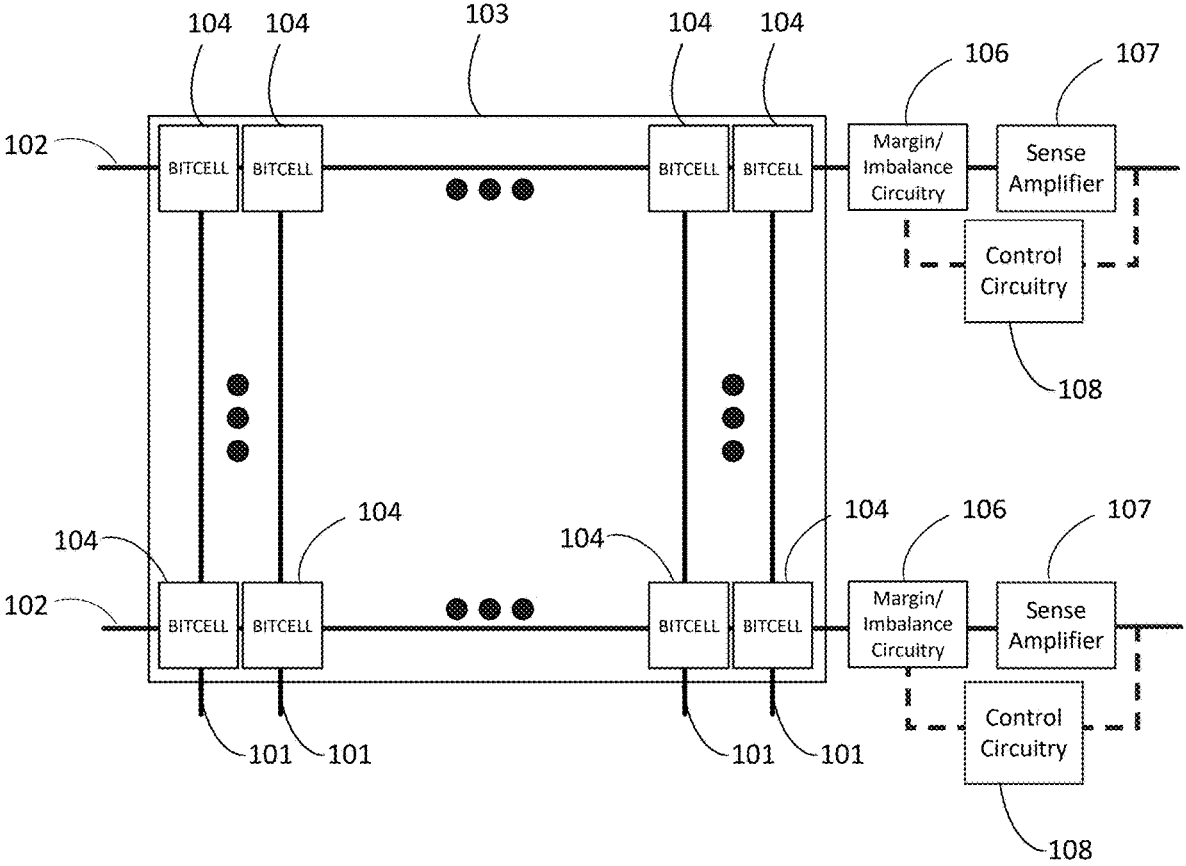
FIG. 1 illustrates a bitcell array with circuitry for accelerated aging of the bitcells, according to an implementation of the subject matter of this disclosure.

Systems and methods for reinforcing an unstable bitcell in an entropy source for use in generating a physical unclonable function (PUF) key are provided through an aging process. The preferred state of the bitcell is reinforced through an accelerated aging process.

The array of bitcells contains multiple bitcells arranged in an array structure including multiple bitline columns and multiple wordline (WL) rows. Each bitline column is controlled by a true bitline (BLT) and complement bitline (BLC). Each wordline row is controlled by a true wordline and a complement wordline. Each bitcell utilizes intrinsic properties of components to supply a readable bit, e.g., logic '0' or logic '1'. In an implementation, each bitline column is coupled to sense amplifier circuitry.

In some implementations, the bitcell is composed of seven transistors with three sets of matching pairs: NTRUE with NCOMP, PTRUE with PCOMP, and PTCC with PCCC. Extracting data from the PUF is achieved by activating a wordline generated from an analog voltage generator that tracks with process, voltage, and temperature. The complement wordline transitions between a voltage provided by a power supply (VDD) and 0V to activate the bitcell during reads. Any mismatch or asymmetry in device parameters (e.g., threshold voltage) results in slight differences in transistor drain currents which impacts the value read by the bitcell. Many bitcells exhibit a centralization around 0 mV of differential signal. This indicates that the transistor pairs within these cells are closely matched, resulting in small differential signal development. Such bitcells are unreliable for use in a PUF key and typically are not used in creating the PUF key.

Typical aging over long periods of time will cause bitcells which read out a value around 0 mV to tend towards greater mismatch and read out a logical '0' or '1' more effectively. In order to reach this desired state sooner, simulated aging can be applied to the bitcell array to reinforce its preferred state. Simulated aging may be applied by inducing bias temperature instability (BTI) or hot carrier injection (HCI).

BTI is an aging effect in transistors which causes an increase in the threshold voltage needed to activate the transistor. HCI is another aging effect in transistors in which a high voltage applied to the transistor causes charge carriers, such as electrons, to become energized and collide with atoms to create additional electron-hole pairs. This also affects the threshold voltage of the transistor by either raising it in n-type transistors (NMOS) or lowering it in p-type transistors (PMOS).

In some implementations, the simulated aging is achieved by applying a known voltage offset to the matched transistor pairs within the bitcell. Applying this voltage offset to the bitcell while reading it will induce HCI stress, or BTI stress, or both, causing the bitcell to experience aging. This will ultimately reinforce the preferred bitcell state and improve stability and repeatability in the PUF key. Reinforcing all bitcells in the bitcell array using these techniques may be referred to as feedback-reinforced accelerated aging (FRAA).

The FRAA technique of this disclosure takes advantage of semiconductor aging mechanisms, HCI and BTI, to eliminate unstable bitcells and reduce the PUF key error rate. The FRAA technique reinforces an unstable bitcell by applying a mismatched voltage to the bitcell, with a higher voltage applied to the portion which is biased toward the preferred state of the bitcell, and a lower voltage applied to the portion which is biased away from the preferred state of the bitcell. The mismatched voltage is applied either locally at the bitcell or along a wordline to all bitcells indexed by that wordline.

The FRAA technique in accordance with the subject matter of this disclosure does not output the PUF data from the entropy source during the procedure. This enables the FRAA process to be performed before delivery of the product to the end user without giving rise to a security concern. The end user is still the first and only one to read the PUF and determine its unique key.

The subject matter of this disclosure may be better understood by reference to FIGS. 1-5.

FIG. 1 illustrates entropy source 100 with circuitry for accelerated aging of the bitcells, according to an implementation of the subject matter of this disclosure.

Bitcell array 103 is made up of bitcells 104 which are arranged along wordlines 101 and bitlines 102. For example, bitcell array 103 may be a 1 kB PUF array with 64 bitlines and 16 wordlines. Data from bitcells 104 are read by sense amplifier 107. Control logic 108 receives the output from sense amplifier 107 and gates the output to zero to prevent the bitcell values from being read outside entropy source 100.

Each bitline 102 has its own sense amplifier 107, margin/imbalance circuitry 106 and control logic 108. Having a sense amplifier 107, margin/imbalance circuitry 106 and control logic 108 along each bitline allows all bitcells in a given wordline to be aged in parallel, reducing the time required to age the entire bitcell array.

The data from sense amplifier 107 is the initial readout data state of the bitcell following a conventional read operation, which indicates the preferred state of the bitcell. Control logic 108 determines the direction of imbalance in the bitcell which indicates which transistor in the transistor pair in the bitcell biases the bitcell toward the preferred state. Margin/imbalance circuitry 106 applies a voltage back to the bitcell in the corresponding bitline in the direction that will accelerate aging and reinforce the preferred state of the bitcell. The voltage applied to the bitcell will have a higher voltage applied to the portion which is biased toward the preferred state of the bitcell and a lower voltage applied to the portion which is biased away from the preferred state of the bitcell. The margin/imbalance current accelerates the aging stress effect in the direction of the preferred state of the bitcell which reinforces the preferred bitcell data state to ensure the bitcell is stable.

Figure 2:
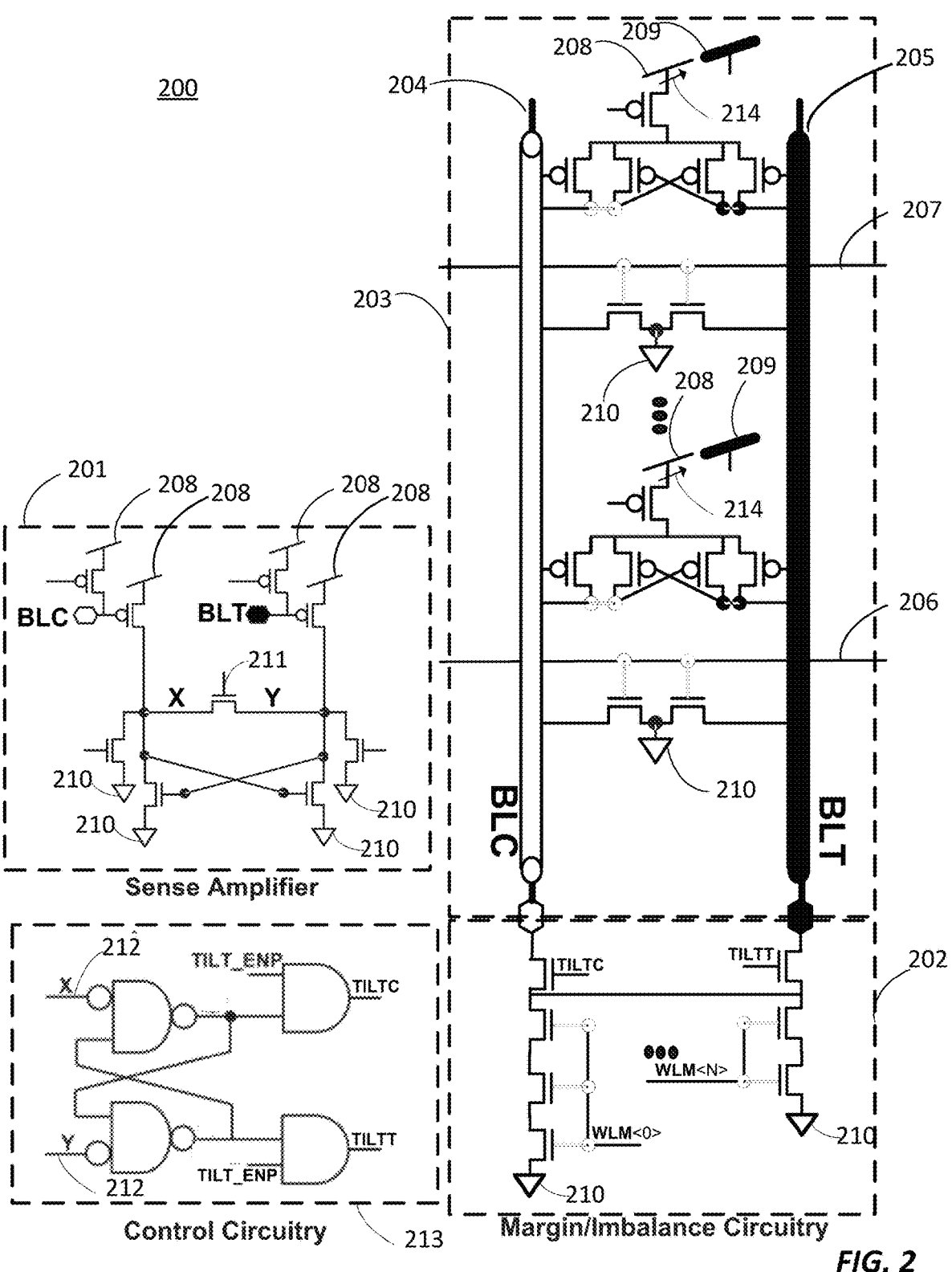
FIG. 2 illustrates a bitline with circuitry for accelerated aging of the bitcells with a voltage source local to each bitcell, according to a first implementation of the subject matter of this disclosure.

FIG. 2 illustrates bitcells arranged along a bitline with circuitry for accelerated aging of the bitcells with a voltage source local to each bitcell, according to a first implementation of the subject matter of this disclosure.

Integrated circuit device ("chip") 200 contains bitline 203, sense amplifier 201, margin/imbalance circuitry 202, and control circuitry 213. Bitline 203 is made up of complement bitline 204 and true bitline 205. Bitcells along bitline 203 are indexed by wordline 206 and wordline 207. Each wordline is controlled by a true wordline and complement wordline. Bitline 203 is connected to sense amplifier 201, margin/imbalance circuitry 202, and control circuitry 213. Prior to performing the FRAA process, a conventional read operation with the bitcells powered by VDD is performed to determine the data stored in each bitcell. The read operation is performed on the bitcell indexed by activated wordline 206. The data is input into sense amplifier 201. Now that the preferred data state of the bitcell indexed by wordline 206 is known, and the FRAA process may begin. The preferred state data for bitcell indexed by wordline 206 is output from sense amplifier 201 at data out 211 and is input to control circuitry 213 at 212. Control circuitry 213 activates a signal which causes a current imbalance in the direction of the preferred bitcell state in the bitcell indexed by wordline 206.

The preferred bitcell state and direction of imbalance are input into margin/imbalance circuitry 202, where current/imbalance FETs (field effective transistors) apply current to ground (VSS) 210.

Inducing a voltage imbalance in the bitcell indexed by wordline 206 requires access to a high voltage for accelerated aging of the bitcell. The high voltage can be generated on chip 200 from a charge pump or off-chip from a special analog voltage supply not on chip 200. In this implementation, multiplexer (MUX) 214 passes either the low voltage 208, VDD, or high voltage 209, VH, directly to the bitcell indexed by wordline 206 during the aging process. The maximum voltage imbalance is used to maximize the aging stress in the minimum amount of time. The bitcell indexed by wordline 206 has a source voltage switched by MUX 214 to a high voltage 209, VH, which allows for higher than nominal voltage stress to occur quickly. The bitcell indexed by wordline 206 is held in this stressed condition for a set duration (e.g., 1 minute, 10 minutes, etc.). At the conclusion of the FRAA procedure, the bitcell indexed by wordline 206 is deactivated by setting the true wordline of wordline 206 to 0V and the complement wordline of wordline 206 to the low voltage 208, VDD. Additionally, MUX 214 switches the voltage applied to the bitcell indexed by wordline 206 to the low voltage 208, VDD, as well. At this point, the procedure can repeat at wordline 207 and incrementally age each bitcell in the bitline wordline-by-wordline until the entire bitcell array has been reinforced. In the example of a 1 kB bitcell array which has sixteen wordlines, this would require sixteen iterations, during each of which the bitcells along one wordline at a time out of the sixteen wordlines, are aged.

Figure 3:
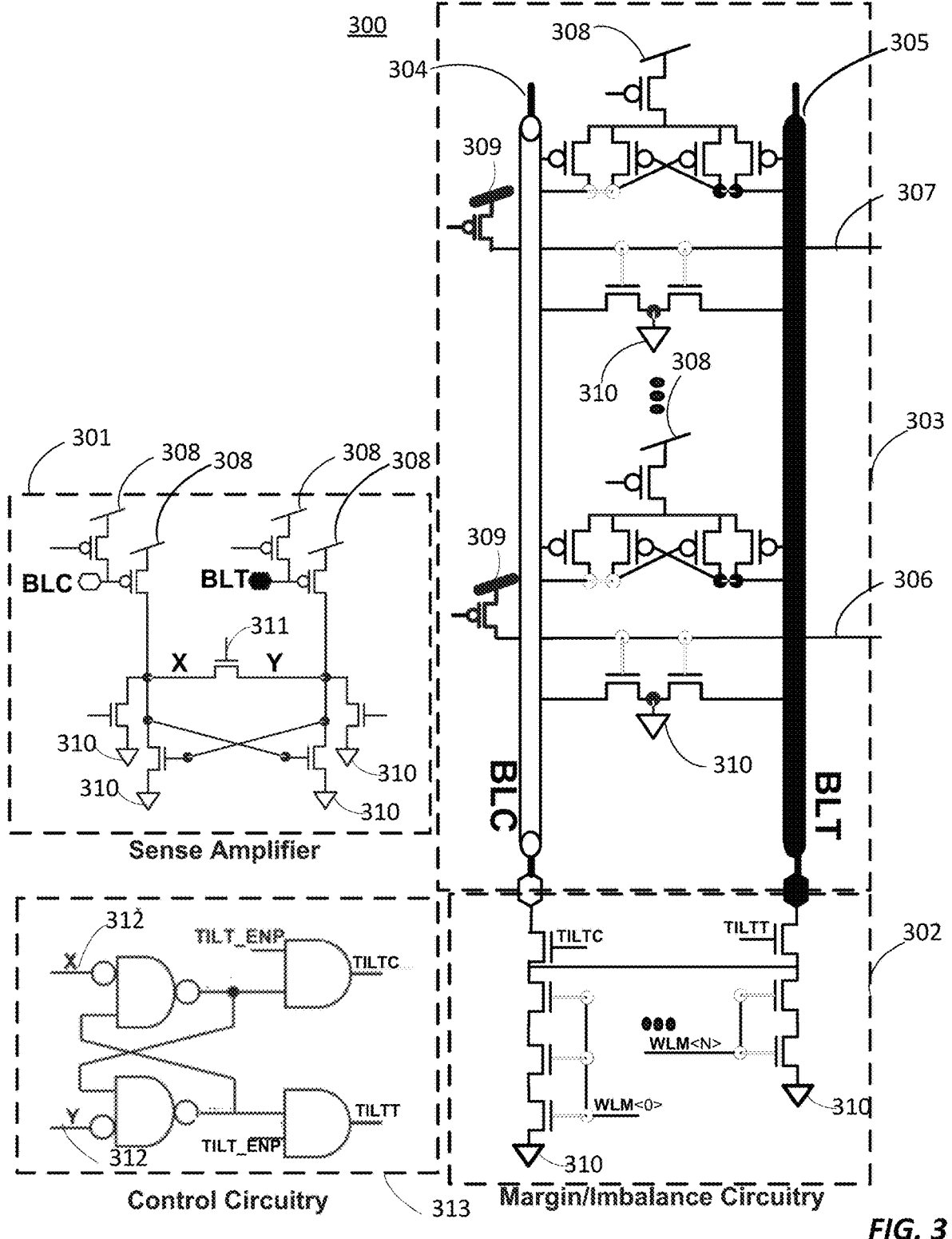
FIG. 3 illustrates a bitline with circuitry for accelerated aging of the bitcells with a voltage source along each wordline, according to a second implementation of the subject matter of this disclosure.

FIG. 3 illustrates bitcells arranged along a bitline, with circuitry for accelerated aging of the bitcells with a voltage source 309 along each wordline, according to a second implementation of the subject matter of this disclosure.

Chip 300 contains bitline 303, sense amplifier 301, margin/imbalance circuitry 302, and control circuitry 313. Bitline 303 is made up of complement bitline 304 and true bitline 305. Bitcells along bitline 303 are indexed by wordline 306 and wordline 307. Each wordline is controlled by a true wordline and complement wordline. Bitline 303 is connected to sense amplifier 301, margin/imbalance circuitry 302, and control circuitry 313. Prior to performing the FRAA process, a conventional read operation with the bitcells is performed to determine the data stored in each bitcell. The read operation is performed on the bitcell indexed by activated wordline 306. The data is input into sense amplifier 301. Now that the preferred data state of the bitcell indexed by wordline 306 is known, the FRAA process may begin. The preferred state data for bitcell indexed by wordline 306 is output from sense amplifier 301 at data out 311 and is input to control circuitry 313 at 312. Control circuitry 313 activates a signal which causes a current imbalance in the direction of the preferred bitcell state in the bitcell indexed by wordline 306.

The preferred bitcell state and direction of imbalance are fed into margin/imbalance circuitry 302, where current/imbalance FETs apply current to ground (VSS) 310.

Inducing a voltage imbalance in the bitcell indexed by wordline 306 requires access to a high voltage for accelerated aging of the bitcell. The high voltage can be generated on-chip 300 from a charge pump or off-chip from a special analog voltage supply not on chip 300. In this implementation, high voltage, VH, 309 is applied to bitcell indexed by wordline 306 during the aging process from a source along wordline 306. The same voltage is applied to all bitcells along the wordline, including bitcells on different bitlines.

The maximum imbalance current is used to maximize the aging stress. Bitcell indexed by wordline 306 has a high voltage from voltage source 309, VH, applied which allows for higher than nominal voltage stress to occur quickly. The bitcell indexed by wordline 306 is held in this stressed read condition for a set duration (e.g., 1 minute, 10 minutes, . . . ). At the conclusion of the FRAA procedure, the bitcell indexed by wordline 306 is deactivated by setting the true wordline of wordline 306 to 0V and the complement wordline of wordline 303 to VDD. Additionally, high voltage from voltage source 309 is deactivated along wordline 306 and the source voltage for the bitcell indexed by wordline 306 returns to the normal low voltage 308, VDD. At this point, the procedure can repeat at wordline 307 and incrementally age each bitcell in the bitline wordline-by-wordline until the entire bitcell array has been reinforced. In the example of a 1 kB bitcell array which has sixteen wordlines, this would require sixteen iterations, during each of which the bitcells along one wordline at a time out of the sixteen wordlines, are aged.

Figure 4:
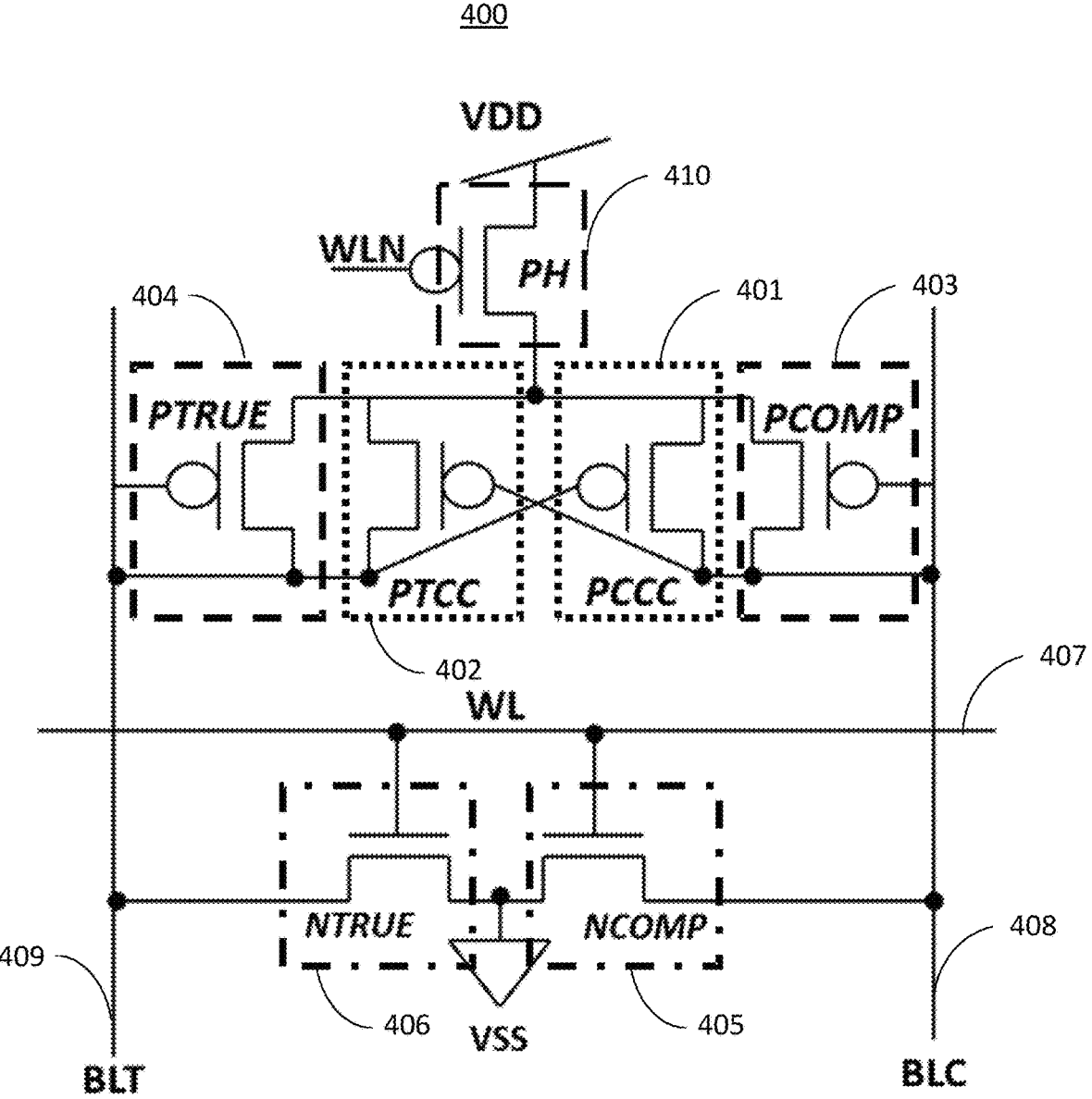
FIG. 4 illustrates a pre-amplifier PUF bitcell, in accordance with the subject matter of this disclosure.

FIG. 4 illustrates a pre-amplifier PUF bitcell, in accordance with the subject matter of this disclosure. Bitcell 400 contains seven transistors, But the PUF data comes from the six core devices: diode-configured PFETs PTRUE 404 and PCOMP 403, cross-coupled PFETs PTCC 402 and PCCC 401, and NFETs NTRUE 406 and NCOMP 405. Access transistor PH 410 enables activation of bitcell 400 when multiple bitcells are connected along the same bitline. Access transistor PH 410 is connected to source voltage VDD. Bitcell 400 is connected to a bitline controlled by bitline true (BLT) 409 and bitline complement (BLC) 408 and wordline WL 407

The diode-configured PFETs, PTRUE 404 and PCOMP 403, have two independent matched pairs to increase randomness and repeatability. PTRUE 404 and PCOMP 403 are arranged such that the gate is connected to BLT 408 and drain is connected to BLC 408 with the source terminal connected to access transistor PH 410.

The cross-coupled PFETs, PTCC 402 and PCCC 401, are amplifying transistors used to pull apart the voltages of BLT 409 and BLC 408 during sensing. PTCC 402 gate control connects to BLC 408 while PCCC 401 gate control connects to BLT 409, which allows for amplification of the separation and a maximum differential voltage between BLT 409 and BLC 408.

The NFETs, NTRUE 406 and NCOMP 405, share a common gate to WL 507 and a common source voltage of 0V. The drain voltage of NTRUE 406 connects to BLT 409 while the drain voltage of NCOMP connects to BLC 408.

When bitcell 400 is read, WL 407 is activated to both NFETs, NTRUE 406 and NCOMP 405. PTRUE and PCOMP are configured to set the BLT 409 and BLC 408 voltages to approximately a threshold voltage (VTH) below VDD. Cross-coupled PFETS PTCC 402 and PCCC 401 each pull BLC 408 and BLT 409 respectively towards VDD. The lower of the voltages of the BLT 409 and BLC 408 generates more overdrive on the other side's PFET. This brings the "weaker" side toward VDD.

FIG. 5 is a flow diagram illustrating a method according to implementations of the subject matter of this disclosure. At 501, an array of bitcells is arranged along bitline columns and wordline rows. Each wordline row is defined by respective pairs of true and complement wordlines. Each bitline is defined by respective pairs of true and complement bitlines. At 502, a preferred state is read from a bitcell using sense amplifier circuitry coupled to the bitline of the bitcell.

At 503, the stress condition which biases the bitcell to the preferred state of the bitcell is determined. At 504, the stress condition which biases the bitcell to the preferred state of the bitcell is applied to bitcell. The stress condition causes the bitcell value to be reinforced to the preferred state.

At 505, a value is read from the bitcell. At 506, the value is used to generate a PUF key.

Thus it is seen that systems and methods for reinforcing an unstable bitcell in an entropy source for use in generating a physical unclonable function (PUF) key are provided through an aging process have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of operating a chip as an entropy source for generating a physical unclonable function (PUF) key, the method comprising:

arranging in the chip a pre-amplifier array of bitcells in respective rows defined by respective pairs of true and complement wordlines and in columns defined by respective pairs of true and complement bitlines;

reading, by a first sense amplifier integrated in the chip and connected to a first pair of the pairs of true and complement bitlines, a first preferred state from a first bitcell along a first selected pair of the pairs of true and complement wordlines, wherein the pre-amplifier array of bitcells comprises the first bitcell;

performing feedback-reinforced accelerated aging via control circuitry in the chip including, based on the read first preferred state, applying a first stress condition that causes an accelerated aging effect in the first bitcell, wherein applying the first stress condition comprises biasing the first bitcell to the first preferred state to reinforce the first preferred state in the first bitcell;

subsequent to performing the feedback-reinforced accelerated aging, reading a first value from the first bitcell; and generating a first PUF key using the first value.

2. The method according to claim 1, wherein applying the first stress condition comprises:

applying a first voltage to a first portion of the first bitcell, which is biased toward the first preferred state; and applying a second voltage to a second portion of the first bitcell, which is biased away from the first preferred state, the second voltage being less than the first voltage.

3. The method according to claim 1, wherein applying the first stress condition comprises applying the first stress condition for longer than a threshold duration.

4. The method according to claim 1, wherein applying the first stress condition comprises causing the first bitcell to exhibit one or more of (1) biased temperature instability or (2) hot carrier injection.

5. The method according to claim 1, further comprising:

reading, by a second sense amplifier connected to a second pair of the pairs of true and complement bitlines, a second preferred state from a second bitcell along the first selected pair of the pairs of true and complement wordlines, wherein the pre-amplifier array of bitcells comprises the second bitcell;

performing feedback-reinforced accelerated aging includ-
ing, based on the second preferred state, applying a
second stress condition that causes an accelerated aging
effect in the second bitcell, wherein applying the sec-
ond stress condition comprises biasing the second
bitcell to the second preferred state to reinforce the
second preferred state in the second bitcell; and
subsequent to performing the feedback-reinforced accel-
erated aging on the second bitcell, reading a second
value from the first bitcell,
wherein generating the first PUF key further comprises
using the second value.

6. The method according to claim 5, wherein the first
stress condition and the second stress condition are applied
simultaneously.

7. The method according to claim 5, wherein:
applying the first stress condition to the first bitcell
comprises activating a first source voltage local to the
first bitcell; and
applying the second stress condition to the second bitcell
comprises applying a second source voltage local to the
second bitcell.

8. The method according to claim 5, wherein applying the
first stress condition to the first bitcell and applying the
second stress condition to the second bitcell comprise apply-
ing a source voltage to the first selected pair of the pairs of
true and complement wordlines.

9. The method according to claim 5, further comprising,
after reading the first value from the first bitcell, deactivating
the first bitcell by applying a zero voltage to the true
wordline of the selected pair of the pairs of true and
complement wordlines and by applying a source voltage to
the complement wordline of the selected pair of the pairs of
true and complement wordlines to prevent the first value
from being read outside of the chip.

10. A chip operating as an entropy source for generating
a physical unclonable function (PUF) key, the chip com-
prising:
a pre-amplifier array of bitcells arranged in respective
rows defined by respective pairs of true and comple-
ment wordlines and in columns defined by respective
pairs of true and complement bitlines;
a first sense amplifier connected to a first pair of the pairs
of true and complement bitlines and configured to read
a first preferred state from a first bitcell of the pre-
amplifier array of bitcells along a first selected pair of
the pairs of true and complement wordlines; and
control circuitry within the chip and configured to per-
form feedback-reinforced accelerated aging including,
based on the read first preferred state, applying a first
stress condition that causes an accelerated aging effect
in the first bitcell, wherein applying the first stress
condition comprises biasing the first bitcell to the first
preferred state to reinforce the first preferred state in the
first bitcell,
wherein
the first sense amplifier is further configured, subse-
quent to performing the feedback-reinforced accel-
erated aging, to read a first value from the first
bitcell, and
the chip further comprises key generation circuitry
configured to generate a first PUF key using the first
value.

11. The chip according to claim 10, wherein the control
circuitry is configured, when applying the first stress con-
dition, to:

apply a first voltage to a first portion of the first bitcell,
which is biased toward the first preferred state, and
apply a second voltage to a second portion of the first
bitcell, which is biased away from the first preferred
state, the second voltage being less than the first
voltage.

12. The chip according to claim 10, wherein the control
circuitry is configured, when applying the first stress con-
dition, to apply the first stress condition for longer than a
threshold duration.

13. The chip according to claim 10, wherein the control
circuitry is configured, when applying the first stress con-
dition, to cause the first bitcell to exhibit one or more of (1)
biased temperature instability or (2) hot carrier injection.

14. The chip according to claim 10, further comprising a
second sense amplifier connected to a second pair of the
pairs of true and complement bitlines and configured to read
a second preferred state from a second bitcell along the first
selected pair of the pairs of true and complement wordlines
wherein:
the pre-amplifier array of bitcells comprises the second
bitcell;
the control circuitry is further configured to perform
feedback-reinforced accelerated aging including, based
on the second preferred state, applying a second stress
condition that causes an accelerated aging effect in the
second bitcell, wherein applying the second stress
condition comprises biasing the second bitcell to the
second preferred state to reinforce the second preferred
state the second bitcell; and
subsequent to performing the feedback-reinforced accel-
erated aging on the second bitcell, the second sense
amplifier is further configured to read a second value
from the second bitcell; and
the key generation circuitry is configured to generate the
first PUF key using the second value.

15. The chip according to claim 14, wherein the control
circuitry is further configured to apply the first stress con-
dition and the second stress condition simultaneously.

16. The chip according to claim 14, wherein the control
circuitry is further configured to:
when applying the first stress condition to the first bitcell,
activate a first source voltage local to the first bitcell;
and
when applying the second stress condition to the second
bitcell, apply a second source voltage local to the
second bitcell.

17. The chip according to claim 14, wherein the control
circuitry is further configured to, when applying the first
stress condition to the first bitcell and applying the second
stress condition to the second bitcell, apply a source voltage
to the first selected pair of true and complement wordlines.

18. The chip according to claim 10, wherein the control
circuitry is further configured to, after reading the first value
from the first bitcell, deactivate the first bitcell by applying
a zero voltage to the true wordline of the selected pair of true
and complement wordlines and by applying a source voltage
to the complement wordline of the selected pair of true and
complement wordlines to prevent the first value from being
read outside of the chip.

19. The chip of claim 10, wherein the first sense amplifier
is configured, in reading the first preferred state, to:
sense a state of the first bitcell; and
output the first preferred state based on the sensed state of
the first bitcell.

20. The chip of claim 10, further comprising imbalance circuitry connected to the pairs of true and complement bitlines, wherein the control circuitry is connected to the first sense amplifier and provides feedback to the imbalance circuitry.

21. The chip of claim 10, further comprising imbalance circuitry connected to the pairs of true and complement bitlines, wherein the control circuitry comprises i) a first plurality of gates connected to outputs of the first sense amplifier, and ii) a second plurality of gates providing feedback to the imbalance circuitry.

22. The chip of claim 10, further comprising imbalance circuitry connected to the pairs of true and complement bitlines, wherein:

the preferred state comprises a pair of bits;

the control circuitry comprises a first pair of gates configured to receive respectively the pair of bits, and a second pair of gates configured to receive outputs of the first pair of gates and generate control signals; and the imbalance circuitry is configured, based on the control signals, to cause a current imbalance in a direction of the first preferred state of the first bitcell.

23. The chip of claim 22, wherein:

the control signals comprise a first control signal and a second control signal; and the imbalance circuitry comprises a first series of transistors connected to the complement bitline of the first bitcell and configured to receive the first control signal and, based on the first control signal, control current flow from the complement bitline to ground, and a second series of transistors connected to the true bitline of the first bitcell and configured to receive the second control signal and, based on the second control signal, control current flow from the true bitline to the ground.

\* \* \* \* \*